United States Patent
Isogai et al.

(10) Patent No.: US 6,637,326 B1
(45) Date of Patent: Oct. 28, 2003

(54) METHOD AND APPARATUS FOR CONTROLLING PUSHING PRESSURE APPLIED TO PRINTING MATERIAL

(75) Inventors: Takeyoshi Isogai, Hekinan (JP); Jun Adachi, Nagoya (JP); Tatsumi Saito, Okazaki (JP); Manabu Mizuno, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/644,649

(22) Filed: Aug. 24, 2000

(30) Foreign Application Priority Data

Sep. 6, 1999 (JP) ............................... 11-251634

(51) Int. Cl.$^7$ ................................................ B41M 1/12
(52) U.S. Cl. ......................... 101/129; 101/123; 101/484
(58) Field of Search .................. 101/123, 124, 101/129, 484, 114, 126

(56) References Cited

U.S. PATENT DOCUMENTS

| 4,622,239 A | 11/1986 | Schoenthaler et al. |
| 4,636,406 A | 1/1987 | Leicht |
| 5,479,854 A | * 1/1996 | Chikahisa et al. ........... 101/123 |
| 5,483,884 A | * 1/1996 | Vellanki ...................... 101/123 |
| 5,893,325 A | * 4/1999 | Sakai .......................... 101/123 |
| 5,894,793 A | * 4/1999 | Sakai .......................... 101/123 |
| 5,988,060 A | * 11/1999 | Asai et al. ................... 101/123 |
| 5,988,856 A | * 11/1999 | Braunstein et al. ......... 101/123 |

FOREIGN PATENT DOCUMENTS

| JP | U-61-138545 | 8/1986 |
| JP | U-63-178137 | 11/1988 |
| JP | A-3-193449 | 8/1991 |
| JP | A-5-193105 | 8/1993 |
| JP | A-8-48024 | 2/1996 |
| JP | A-11-227157 | 8/1999 |

* cited by examiner

*Primary Examiner*—Ren Yan
(74) *Attorney, Agent, or Firm*—Oliff & Berridge, PLC

(57) ABSTRACT

A method of method of controlling a pushing pressure which is applied to a printing material, such as a creamed solder, to push the material out of a printing head of a screen printing apparatus and print the material on an object, such as a printed wiring board, through at least one through-hole of a screen of the apparatus while at least one of the head and the screen is moved relative to the other of the head and the screen in a direction parallel to the screen, the method comprising the step of changing the pushing pressure applied to the printing material, while a printing operation is carried out on the object by the screen printing apparatus.

16 Claims, 10 Drawing Sheets

| PUSHER SEQUENCE | X: 0.01mm | PUSHER: 0.1kgf/cm² | SPEED: mm/sec |
|---|---|---|---|
| | X | PUSHER | SPEED |
| STEP 1 | 35000 | 20 | 100 |
| STEP 2 | 16000 | 25 | 100 |
| STEP 3 | 15000 | 0 | 100 |
| STEP 4 | 10000 | 30 | 50 |
| STEP 5 | -1000 | 0 | 0 |
| STEP 6 | | | |
| STEP 7 | | | |
| STEP 8 | | | |
| STEP 9 | | | |
| STEP 10 | | | |

METHOD AND APPARATUS FOR CONTROLLING PUSHING PRESSURE APPLIED TO PRINTING MATERIAL

BACKGROUND OF INVENTION

1. Field of Invention

The present invention relates to a screen printing apparatus for pushing a printing material out of a printing head and printing the printing material on an object through a screen having one or more through-holes, and particularly to a method and an apparatus for controlling a pushing pressure applied to the printing material.

2. Related Art Statement

A conventional screen printing apparatus is disclosed in Japanese Patent Application laid open under Publication No. 8(1996)-48024. The screen printing apparatus includes (a) a printing-material container which accommodates, in a printing-material chamber thereof, a printing material and opens toward a screen and (b) a printing-material pusher which applies a pushing pressure to the printing material accommodated in the chamber and pushes the material out of the chamber. The pusher includes a pushing plate which is slideably fitted in the chamber and pushes the printing material out of the chamber, and a pushing air-cylinder device as a drive source that drives or moves the pushing plate in the chamber. The screen printing apparatus further includes a control device which controls the pressure of air supplied to the air cylinder, such that the pushing plate pushes, with a predetermined pushing pressure, the printing material out of the chamber. The pushing pressure is predetermined depending upon the sort and/or viscosity of the printing material used.

The above-described screen printing apparatus maintains the predetermined pushing pressure throughout one printing operation. However, the through-holes of the screen have different shapes, sizes and/or orientations, and are distributed at different densities. If the predetermined pressure is kept during one full printing operation, an insufficient amount of printing material may be printed on some portions of the object, and an excessive amount of printing material may be printed on other portions of the object. Thus, an uneven printing may occur to the object. For example, in the case where the printing material is squeezed into a through-hole having such a shape that the hole is wide in the direction of extension of the opening outlet of the printing-material chamber, a sufficient amount of printing material can be easily squeezed into the hole with a low pushing pressure. On the other hand, in the case of a through-hole having a shape that the hole is narrow in the above direction, there is such a tendency that a considerably high pushing pressure may be needed to squeeze a sufficient amount of printing material into the hole. Thus, in the case where a screen has a plurality of through-holes which have different shapes, sizes and/or orientations and/or are distributed at different densities (hereinafter, simply referred to as "a complex printing pattern"), an uneven printing is likely to occur. Therefore, when a screen having a complex printing pattern is used, an operator needs to carefully adjust the pushing pressure. However, this adjusting operation takes a lot of time, and the quality of printing depends on the skill of the operator.

SUMMARY OF INVENTION

The present invention provides a pushing-pressure controlling method, a screen printing apparatus, and a recording medium which have one or more of the following technical features that are described below in respective paragraphs given parenthesized sequential numbers (1) to (21). Any technical feature that includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a method of controlling a pushing pressure which is applied to a printing material, such as a creamed solder, to push the material out of a printing head of a screen printing apparatus and print the material on an object, such as a printed wiring board, through at least one through-hole of a screen of the apparatus while at least one of the head and the screen is moved relative to the other of the head and the screen in a direction parallel to the screen, the method comprising the step of changing the pushing pressure applied to the printing material, while a printing operation is carried out on the object by the screen printing apparatus.

The pushing-pressure controlling method according to the first feature (1) can change the pushing pressure while one printing operation is carried out on one object. Therefore, the printing material can be printed, with an appropriate pushing pressure, on each portion of the object, depending upon, e.g., the shape of each through-hole of the screen. Thus, the quality of printing can be easily improved. However, it is difficult for an operator to change the pushing pressure during one printing operation.

Accordingly, it is preferred to prepare, before one printing operation, a command to change the pushing pressure, and automatically change, during the printing operation, the pushing pressure according to the prepared command. In addition, it is preferred to change the pushing pressure at a time when the printing material is not squeezed into any through-holes of the screen, that is, a pushing portion of the screen printing apparatus that pushes the printing material is moving above the screen but is not facing any through-holes of the screen, or when the material is being squeezed into the least number of through-holes. Moreover, it is preferred to complete changing the pushing pressure in a short time.

(2) According to a second feature of the present invention that includes the first feature (1), the step of changing the pushing pressure comprises changing the pushing pressure according to a predetermined pressure pattern representing a relationship between relative position of the printing head and the screen, and pressure.

The pushing-pressure controlling method according to the second feature (2) employs a predetermined pattern indicating the change of pushing pressure, and changes the pushing pressure according to the pattern. A shorter time is needed for an operator to prepare the pattern than a time needed for the operator to prepare one or more individual commands to change the pushing pressure. Thus, the efficiency of operation of the operator is improved. In addition, the quality of printing is stabilized irrespective of the degree of skill of the operator. It is preferred to prepare the pressure pattern based on, e.g., the shape(s) of the through-hole(s) of the screen, and it is preferred to prepare respective exclusive pressure patterns for individual screens.

(3) According to a third feature of the present invention that includes the second feature (2), the method further comprises the steps of inspecting a condition of the printing material printed on the object; and adjusting, based on a result of the inspection, the pushing pressure changed according to the predetermined pressure pattern.

The pushing-pressure controlling method according to the third feature (3) adjusts, based on the inspected condition of the printing material printed on the object, the pushing pressure for being used in another printing operation for another object. Therefore, even if the quality of printing performed in an initial period according to the predetermined pressure pattern may be not satisfactory, the quality of printing can be eventually improved and satisfied as the total number of objects printed increases. The condition of the printing material printed on the object may be at least one of (a) the amount of printing material printed on the object, (b) the shape of printing material printed on the object, and (c) the thickness of printing material printed on the object. The inspection of the condition of the printing material may be performed each time one printing operation for one object is finished, or for only a predetermined number of objects on each of which the printing material has been printed in an initial screen-printing period.

Alternatively, the inspection may be performed for each object until the inspection is performed for a predetermined number of objects in an initial period and it is ascertained that printing operations can be stably performed. Otherwise, the inspection may be performed for every second, third, object, i.e., every n-th object ("n" is a natural number not smaller than two).

(4) According to a fourth feature of the present invention, there is provided a method of controlling a pushing pressure which is applied to a printing material to push the material out of a printing head of a screen printing apparatus and print the material on an object through at least one through-hole of a screen of the apparatus, while at least one of the head and the screen is moved relative to the other of the head and the screen in a direction parallel to the screen, the method comprising the steps of inspecting a condition of the printing material printed on the object; and automatically adjusting, based on a result of the inspection, the pushing pressure applied to the printing material.

The explanation made for the third feature (3) is true with the pushing-pressure controlling method according to the fourth feature (4). However, according to the present method, the pushing pressure may be changed during one printing operation or may be maintained at a prescribed value.

(5) According to a fifth feature of the present invention that includes the third or fourth feature (3) or (4), the step of inspecting the condition comprises taking an image of the printing material printed on the object.

If an image taking device takes an image of the printing material printed on the object and a data processor (e.g., a computer) processes a batch of image data representing the taken image, the condition of the printing material can be quickly inspected.

(6) According to a sixth feature of the present invention that includes the fifth feature (5), the step of taking the image comprises emitting a planar light toward the object and the printing material printed on the object and taking an image of respective portions of the object and the printing material that are exposed to the planar light.

If the planar light is incident to respective plane surfaces of the object and the printing material, respective linear portions (i.e., narrow, belt-like portions) of the object and the material are exposed to the planar light, and an image including the light linear portions of the object and the material and the dark remaining portions of the object and the material is taken. However, since the printing material printed on the object projects from the upper surface of the object and has a three-dimensional shape, the respective exposed linear portions of the object and the material are separated from each other in a three-dimensional space. If the above image is taken in a direction intersecting the planar light, a two-dimensional image including the two or more light linear portions can be taken. This two-dimensional image includes information representing the thickness of the printing material. Thus, information representing, e.g., the thickness or volume of the printing material printed on the object can be obtained by processing one or more batches of image data representing one or more two-dimensional images thus taken. It is preferred to process a plurality of batches of image data representing a plurality of two-dimensional images. If a greater number of two-dimensional images are processed, information approximating the three-dimensional image of the printing material can be obtained. Thus, a three-dimensional shape and three dimensions of the printing material, and/or positions of the printing material on the object can be obtained. It is possible to emit simultaneously a plurality of planar lights toward the object and take simultaneously a plurality of two-dimensional images of the object and the printing material. Alternatively, as will be described in the following feature (7), it is possible to move at least one of an image taking device (and a lighting device) and the object relative to the other of the image taking device (and the lighting device) and the object in a direction parallel to the upper surface of the object and take a plurality of two-dimensional images at different timings.

(7) According to a seventh feature of the present invention that includes the sixth feature (6), the step of inspecting the condition comprises taking respective images of a plurality of portions of the object and a plurality of portions of the printing material printed on a surface of the object that are sequentially exposed to the planar light when at least one of the planar light and the object is moved relative to the other of the planar light and the object in a direction parallel to the surface of the object; and calculating, based on the taken images, an amount of the printing material printed on the object.

The method according to the seventh feature (7) can determine the amount or volume of the printing material by processing only a less amount of image data than the entire batch of image data representing the entire surface of the object, because the respective images of the respective light portions of the object and the printing material are formed within a considerably narrow area only in the entire vision field of the image taking device that can cover the entire surface of the object. Therefore, the condition of the printing material can be inspected in a short time and accordingly the pressing pressure can be adjusted in a short time. This processing method is performed by a three-dimensional-data obtaining apparatus disclosed in Japanese Patent Application No. 11(1999)-226587 and the corresponding U.S. Patent Application assigned to the assignee of the present application.

(8) According to an eighth feature of the present invention, there is provided a screen printing apparatus for printing a printing material on an object through a screen having at least one through-hole, comprising a printing head which includes (A) a printing-material container having (a1) a printing-material chamber in which the printing material is accommodated, and (a2) a printing-material outlet which communicates with the printing-material chamber and opens toward the screen, and (B) a printing-material pushing device which applies a pushing pressure to the printing material accommodated in the printing-material chamber to push the material out of the chamber; a moving device which moves at least one of the printing head and a combination of the screen and the object relative to the other of the head and the combination, in a direction parallel to the screen; and a pushing-pressure control device which controls the pushing pressure applied to the printing material by the printing material pushing device and which includes a pushing-pressure changing portion which changes the pushing pressure applied to the printing material while a printing operation is carried out on the object by the screen printing apparatus.

The screen printing apparatus according to the eighth feature (8) can perform the method according to the first feature (1). The control of the pushing pressure may be a so-called feed-back control in which an actual pushing pressure is detected and controlled, or a so-called open-loop control in which an actual pushing pressure is not detected.

(9) According to a ninth feature of the present invention that includes the eighth feature (8), the printing-material outlet linearly extends in a direction intersecting the direction in which the moving device moves the one of the printing head and the combination of the screen and the object relative to the other of the head and the combination, the printing-material chamber has a length substantially equal to a length of the outlet, and the printing-material pushing device includes a pushing member which is substantially fluid-tightly fitted in the printing-material chamber and a pushing-member drive device which moves the pushing member in the chamber toward the outlet.

In the case where the printing-material outlet is short, it is possible to apply a pressurized gas directly to the printing material accommodated in the printing-material chamber and control the pushing pressure by controlling the pressure of the pressurized gas. However, if this method is employed in the case where the outlet is long, a gas passage may be produced or created through the printing material when the remaining amount of the printing material in the printing-material chamber decreases, so that the pressurized gas blows out of the outlet, thereby making it impossible to continue printing. This problem may be solved by providing a pressing piston in a pressing chamber which has a small cross section and communicates with the printing-material chamber, and moving the pressing piston in the pressing chamber to equally pressurize all the printing material accommodated in the chamber. However, since, generally, a printing material has a high viscosity, the pressing piston cannot equally apply the pressure over the entirety of the long outlet, and accordingly the pushing pressure cannot be effectively controlled. In contrast, the screen printing apparatus according to the ninth feature (9) can uniformly apply the pushing pressure to the printing material over the entirety of the long printing-material outlet, and can effectively control the pushing pressure over the entirety of the long outlet.

(10) According to a tenth feature of the present invention that includes the ninth feature (9), the pushing-member drive device comprises a pressurized-air-operated cylinder device, and the pushing-pressure control device comprises a pressure control device which controls a pressure of a pressurized air supplied to the cylinder device.

The screen printing apparatus according to the tenth feature (10) employs the pressurized-air-operated cylinder device (so-called "air cylinder") as the drive source that drives or moves the pushing member, and accordingly the pushing-member drive device can be produced with ease and at low cost. In addition, the control of the pressure of the pressurized air supplied to the air cylinder is easy.

(11) According to an eleventh feature of the present invention that includes any one of the eighth to tenth features (8) to (10), the pushing-pressure control device comprises a pattern-using control portion which changes the pushing pressure applied to the printing material according to a predetermined pressure pattern representing a relationship between relative position of the printing head and the screen, and pressure.

The screen printing apparatus according to the eleventh feature (11) can carry out the method according to the second feature (2).

(12) According to a twelfth feature of the present invention that includes the eleventh feature (11), the apparatus further comprises a condition inspecting device which inspects a condition of the printed material printed on the object, and the pushing-pressure control device further comprises a pushing-pressure adjusting portion which adjusts, based on a result of the inspection, the pushing pressure changed by the pattern-using control portion.

The screen printing apparatus according to the twelfth feature (12) can carry out the method according to the third feature (3).

(13) According to a thirteenth feature of the present invention, there is provided a screen printing apparatus for printing a printing material on an object through a screen having at least one through-hole, comprising a printing head which includes (A) a printing-material container having (a1) a printing-material chamber in which the printing material is accommodated, and (a2) a printing-material outlet which communicates with the printing-material chamber and opens toward the screen, and (B) a printing-material pushing device which applies a pushing pressure to the printing material accommodated in the printing-material chamber to push the material out of the chamber; a moving device which moves at least one of the printing head and a combination of the screen and the object relative to the other of the head and the combination, in a direction parallel to the screen; a condition inspecting device which inspects a condition of the printed material printed on the object; and a pushing-pressure control device which controls, based on a result of the inspection, the pushing pressure applied to the printing material by the printing-material pushing device.

The screen printing apparatus according to the thirteenth feature (13) can carry out the method according to the fourth feature (4).

(14) According to a fourteenth feature of the present invention that includes the twelfth or thirteenth feature (12) or (13), the condition inspecting device comprises an image taking device which takes an image of the printing material printed on the object.

(15) According to a fifteenth feature of the present invention that includes the fourteenth feature (14), the condition inspecting device further comprises an amount calculating device which calculates, based on a batch of image data which is produced by the image taking device and represents the taken image, an amount of the printing material printed on the object.

(16) According to a sixteenth feature of the present invention, there is provided a recording medium for recording a program such that the program is readable by a computer to control a pushing pressure applied to a printing material to push the material toward a screen having at least one through-hole and print the material on an object through the through-hole of the screen, the program comprising the step of changing the pushing pressure applied to the printing material, depending on a position where the printing material is printed on the object.

The recording medium according to the sixteenth feature (16) can carry out the method according to the first feature (1).

(17) According to a seventeenth feature of the present invention, there is provided a recording medium for recording a program such that the program is readable by a computer to control a pushing pressure applied to a printing material to push the material out of a printing head of a screen printing apparatus and print the material on an object through at least one through-hole of a screen of the apparatus, while at least one of the printing head and the screen is moved relative to the other of the head and the screen in a direction parallel to the screen, the program comprising the steps of obtaining a basic information needed to control the pushing pressure; and controlling the pushing pressure applied to the printing material, based on the obtained basic information.

The basic information may include at least one information selected from the group consisting of a predetermined pressure pattern representing a relationship between relative position of the printing head and the screen, and pressure, and an inspection result obtained by inspecting a condition of the printing material printed on the object.

(18) According to an eighteenth feature of the present invention that includes the seventeenth feature (17), the basic information comprises information indicating that the pushing pressure is changed depending upon a position where the printing material is printed on the screen.

The recording medium according to the eighteenth feature (18) may employ the second or third feature (2) or (3).

(19) According to a nineteenth feature of the present invention that includes the seventeenth or eighteenth feature (17) or (18), the step of obtaining the basic information comprises obtaining, as the basic information, information relating to a condition of the printing material printed on the object.

The recording medium according to the nineteenth feature (19) may employ any one of the fifth to seventh features (5) to (7).

(20) According to a twentieth feature of the present invention, there is provided a recording medium for recording a program such that the program is readable by a computer to control a pushing pressure applied to a printing material to push the material toward a screen having at least one through-hole and print the material on an object through the through-hole of the screen, the program comprising the steps of obtaining a basic information needed to control the pushing pressure; and controlling the pushing pressure applied to the printing material, based on the obtained basic information.

The recording medium according to the twentieth feature (20) may employ any one of the first to seventh features (1) to (7).

(21) According to a twentieth feature of the present invention, there is provided a method of controlling a speed at which at least one of a printing head and a screen of a screen printing apparatus is moved relative to the other of the head and the screen, in a direction parallel to the screen, while a printing material is pushed out of the head and is printed on an object through at least one through-hole of the screen, comprising the step of changing the speed while a printing operation is carried out on the object by the screen printing apparatus.

In addition to, or in place of, the changing of the pushing pressure according to any one of the above-described features, the present method is for changing the speed at which at least one of the printing head and the screen is moved relative to the other of the head and the screen. Thus, the present method can improve the quality of printing of a complex pattern including different portions whose through-holes have different shapes, sizes, and/or orientations and are distributed at different densities. In the case where the pushing pressure is not changed, more printing material can be squeezed into the through-holes when the speed of relative movement of the printing head and the screen is lower. Therefore, if the relative-movement speed is low for the portion(s) where a printing defect is likely to occur and is high for the portion(s) where the defect is unlikely, the quality of printing can be improved while lowering of the efficiency of printing is prevented.

BRIEF DESCRIPTION OF DRAWINGS

The above and optional objects, features, and advantages of the present invention will be better understood by reading the following detailed description of the preferred embodiments of the invention, when considered in conjunction with accompanying drawings, in which:

FIG. 11 is an illustrative view of a two-dimensional image of the creamed solder that is formed on an image-take surface of the two-dimensional-image taking device of FIG. 11.

DETAILED DESCRIPTION OF PREFERRED EMBODIMENTS

Figure 1:
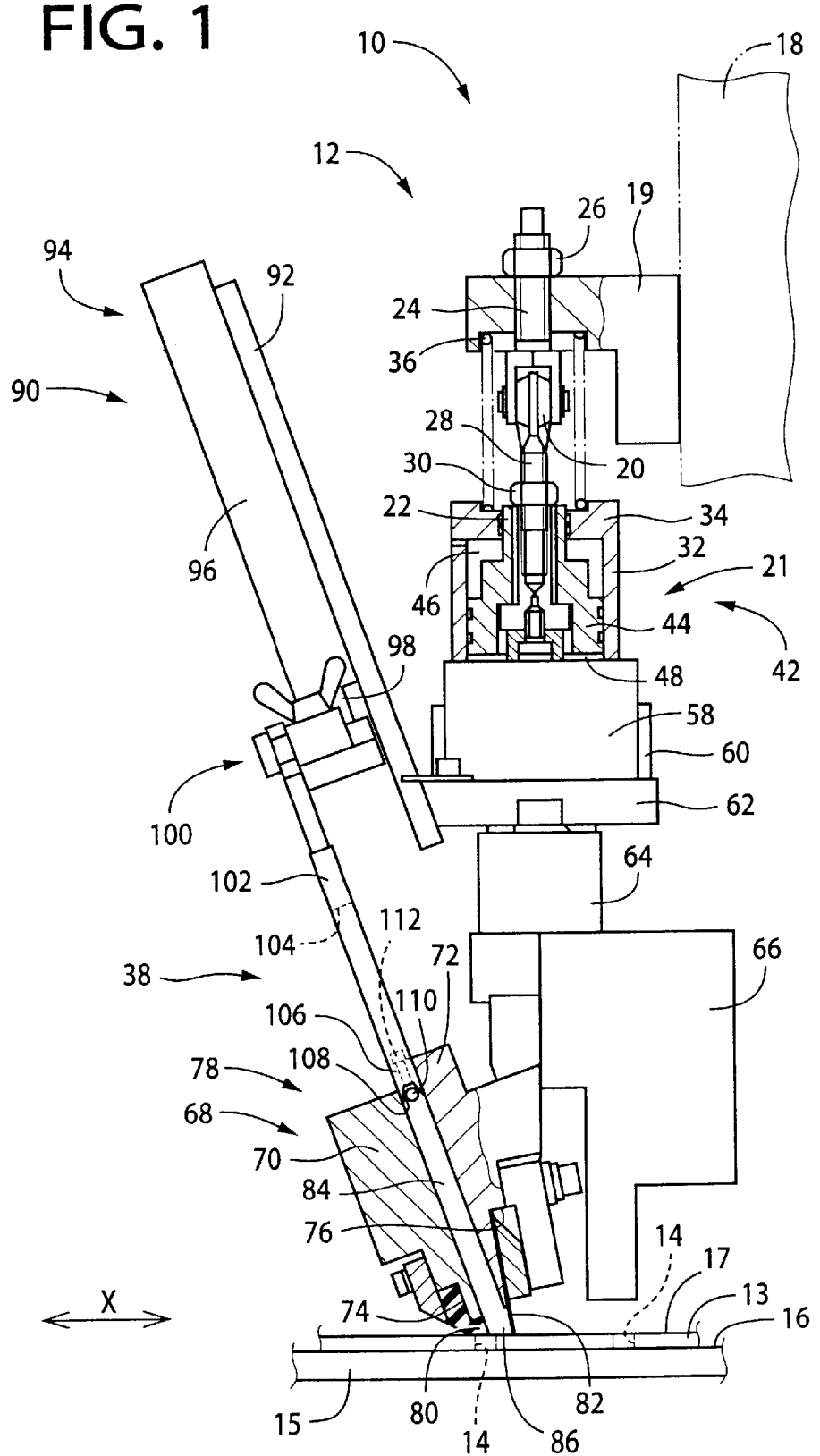
FIG. 1 is a partly cross-sectioned, elevation view of an essential portion of a screen printing apparatus which includes a pushing-pressure control device embodying the present invention and which carries out a pushing-pressure control method enbodying the present invention.

FIG. 1 shows a screen printing apparatus 10 embodying the present invention.

Since the screen printing apparatus 10 is identical, with respect to many portions thereof, with the screen printing apparatus disclosed in the previously-mentioned Japanese patent document No.8-48024, those identical portions of the apparatus 10 will be described briefly and different portions thereof will be described in detail.

The present screen printing apparatus 10 includes a frame member (not shown) which has an inverted-U-shaped configuration and to which a squeegee unit 12 is fixed. The frame member is provided on an X-axis slide member (not shown) and, when the X-axis slide member is moved in an X-axis direction by a squeegee moving device (not shown), the frame member is also moved in the X-axis direction. In the present embodiment, the X-axis direction is a squeegee-move direction or a screen-print direction. The squeegee moving device is disclosed in Japanese Patent Application laid open under Publication No. 11(1999)-227,157 and the corresponding U.S. patent application Ser. No. 09/247,013 assigned to the assignee of the present application, and accordingly is not described here.

At a printing position where the screen printing apparatus 10 carries out an printing operation on a printed wiring board ("PWB") 15 as an object, a screen 13 is supported by a screen supporting device (not shown). The screen 13 has a plurality of through-holes 14 formed through the thickness thereof. The PWB 15 is positioned relative to the screen 13 such that an upper plane surface 16 thereof contacts a lower surface of the screen 13 so that a creamed solder supplied from the squeegee unit 12 is printed on the upper surface 16 through the through-holes 14 of the screen 13. More specifically described, a PWB conveying device (not shown) conveys the PWB 15 to a position right below the screen 13, and a PWB supporting device (not shown) positions and supports, a support surface thereof, the PWB 15 conveyed by the PWB conveyor. Then, the screen 13 is lowered, or the PWB supporting device is elevated, so that the PWB 15 is held in contact with the screen 13 or is positioned adjacent to the screen 13. A printing operation is carried out in such a manner that the squeegee unit 12 is moved in the X-axis direction parallel to the screen 13, i.e., in the squeegee-move or screen-print direction, while the unit 12 is held in pressed contact with an upper plane surface 17 of the screen 13 that is opposite to the PWB 15. Thus, the squeegee unit 12 squeezes the creamed solder into the through-holes 14 of the screen 13, thereby printing the creamed solder on the upper surface 16 of the PWB 15.

The squeegee unit 12 is supported by a retainer member 19 which is elevated and lowered by a printing-head elevating and lowering air-cylinder device (not shown) while the retainer member 19 is guided by a guide member 18, indicated at two-dot chain line in FIG. 1. The air-cylinder device is fixed to the above-described frame member. A piston rod 22 of a contact-load-adjusting air-cylinder device 21 is connected via a universal joint 20 to the retainer member 19. The universal joint 20 includes an externally threaded portion 24 with which a nut 26 is threadedly engaged and, owing to the engagement of the threaded portion 24 and the nut 26, the joint 20 is connected to the retainer member 19. The universal joint 20 includes another externally threaded portion 28 with which another nut 30 is threadedly engaged and, owing to the engagement of the threaded portion 28 and the nut 30, the joint 20 is connected to the piston rod 22.

A compression coil spring 36 as a biasing device is provided between the retainer member 19 and a top wall 34 of a housing 32 of the contact-load-adjusting air cylinder 21, and biases the housing 32 in a downward direction. The coil spring 36 and the air cylinder 21 cooperate with each other to provide a contact-load adjusting device 42 which adjusts a contact load with which a printing head 38, described later, contacts the screen 13.

Figure 2:
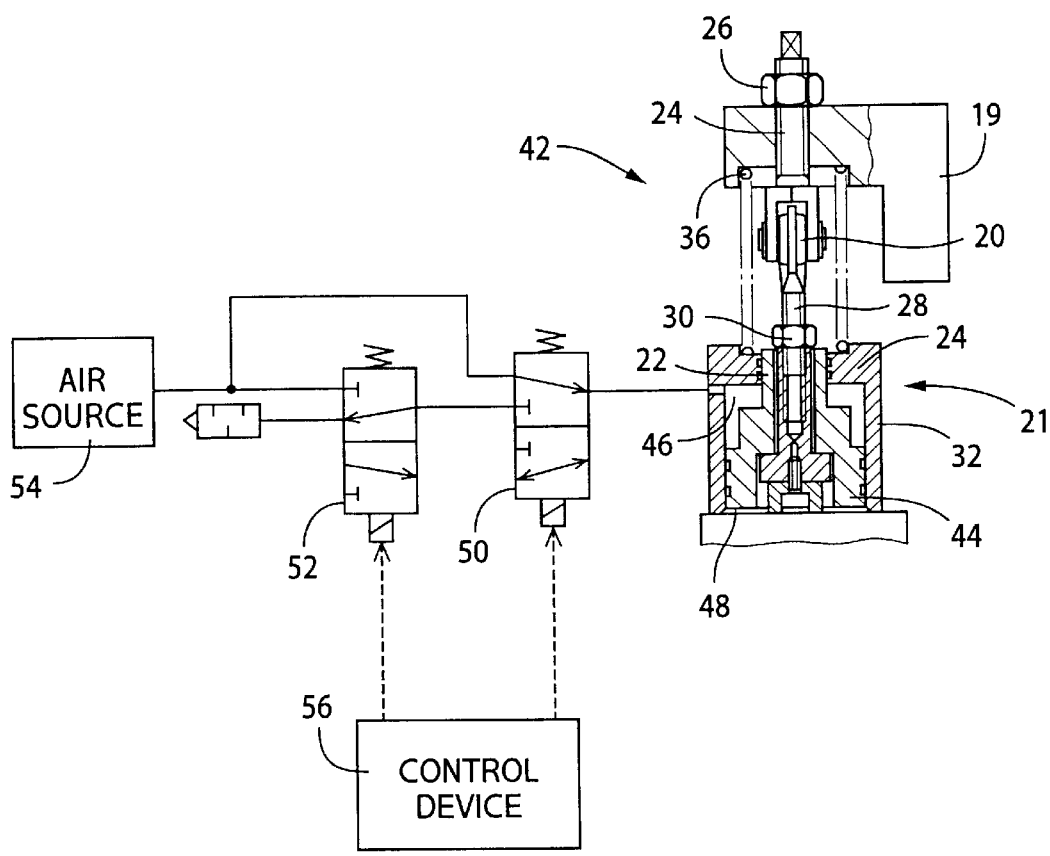
FIG. 2 is a diagrammatic view of a control circuit which controls a contact-load adjusting air-cylinder device of the screen printing apparatus.

Since the contact-load adjusting device 42 is described in detail in the above-indicated Japanese Patent Application laid open under Publication No.11 (1999)227,157 and the corresponding U.S. patent application Ser. No. 09/247,013, the adjusting device 42 is briefly described here. A piston 44 which is fixed to the piston rod 22 is air-tightly and slideably fitted in the housing 32, an air chamber 46 is provided above the piston 44, and an atmospheric-pressure chamber 48 which is communicated with the atmosphere is provided below the piston 44. The air chamber 46 is selectively communicated with an air source 54 and the atmosphere by a solenoid-operated direction-switch valve 50 and a solenoid-operated proportioning valve 52, both shown in FIG. 2. The air source 54 supplies a pressurized air to the air chamber 46, thereby applying an upward force to the housing 32.

The direction-switch valve 50 is provided between the air chamber 46 and the air source 54, and the proportioning valve 52 is provided between the direction-switch valve 50 and the air source 54, and reduces the pressure of the pressurized air supplied from the air source 54. The switching of the direction-switch valve 50 is controlled by a control device 56 so as to selectively place the air chamber 46 in a first state in which the air chamber 46 is communicated with the air source 54 and a second state in which the chamber 46 is communicated with the atmosphere. In the above-indicated first state, the housing 32 is positioned at its upper-end position where the piston 44 contacts a linearly movable member 58, described below. As described later, the control device 56 controls, based on the actual contact load with which the printing head 38 contacts the screen 13, an electric current supplied to the proportioning valve 52, thereby controlling the air pressure in the air chamber 46 such that the actual contact load becomes equal to a prescribed value.

As shown in FIG. 1, the linearly movable member 58 is fixed to a lower surface of the housing 32, and supports a support shaft member 60 such that the shaft member 60 extends parallel to the squeegee-move direction. The shaft member 60 supports a pivotable member 62 such that the pivotable member 62 is pivotable about a straight axis line which is perpendicular to a straight line perpendicular to the screen 13 and is parallel to the screen 13, i.e., a straight axis line parallel to the screen-print direction.

The printing head 38 is attached to a lower surface of the pivotable member 62 via two load sensors 64 each as a sort of contact-load detecting device. Thus, the load sensors 64 and the printing head 38 are pivotable with the pivotable member 62 about the axis line parallel to the screen-print direction, and are elevated and lowered by the printing-head elevating and lowering air cylinder (not shown) and the contact-load adjusting air cylinder 21.

The two load sensors 64 are provided between the pivotable member 62 and a support member 66 such that the two load sensors 64 are symmetrical with each other with respect to the vertical axis line of the air cylinder 21 and are arranged side by side in a Y-axis direction perpendicular to the X-axis direction and parallel to the screen 13. Each load sensor 64 has a prismatic shape whose cross section is rectangular, and has a through-hole which is formed in a widthwise direction thereof through an intermediate portion thereof. Each load sensor 64 has an elongate shape, and has four strain gauges (not shown) which cooperate with one another to provide a bridge circuit. A strain produced in each of the strain gauges is converted by the bridge circuit into an electric signal, which in turn is supplied to the control device 56 via a signal processing circuit (not shown). The two load sensors 64 are provided, between the pivotable member 62 and the support member 66, at respective positions distant from each other in the Y-axis direction, and each of the two load sensors 64 extends parallel to the Y-axis direction, such that an upper portion of one of lengthwise opposite end portions of the each load sensor 64 is fixed to the pivotable member 62, and a lower portion of the other end portion of the each sensor 64 is fixed to the support member 66. Each load sensor 64 is attached to the pivotable member 62 and the support member 66 such that a small space is left between the above-indicated other end portion of the each sensor 64 and the pivotable member 62 and a small space is left between the above-indicated one end portion of the each sensor 64 and the support member 66. Therefore, when a load is applied to the each load sensor 64, a strain is produced in one of the four gauges of the each sensor 64.

The support member 66 of the printing head 38 supports a printing-material container 68 such that the container 68 is detachable from the support member 66. The container 68 is supported by the support member 66 such that the container 68 is inclined relative to a vertical plane perpendicular to the screen 13. More specifically described, the container 68 is inclined such that as seen in an upward direction, a distance between the container 68 and the support member 66 increases toward a downstream side of the container 68 as seen in the screen-print direction. The printing-material container 68 includes elongate first and second plate-like members 70, 72. The first and second members 70, 72 have respective elongate recesses 74, 76 which are formed therethrough in a lengthwise direction thereof and each of which opens in a side surface and a lower surface of a corresponding one of the two members 70, 72. Two side plates (not shown) are fixed to respective lengthwise opposite ends of the two members 70, 72 to close lengthwise opposite ends of an elongate space defined between the two members 70, 72. Thus, the two plate-like members 70, 72 and the two side plates cooperate with one another to provide a main body of the printing-material container 68.

When a printing material is supplied to the main body 78 of the printing-material container 68, first, the first plate-like member 70 is opened to allow the supplying of the printing material. More specifically described, the connection of the first plate-like member 70 to the second plate-like member 72 is disconnected, and the upper portion of the first member 70 is moved away from the second member 72, so that the main body 78 is opened. In a state in which the first member 70 is kept inclined such that as seen in an upward direction, a distance between the first and second members 70, 72 increases toward a downstream side of the main body 78 as seen in the screen-print direction, a printing-material supplying device (not shown) supplies the printing material to the container 68.

An elongate squeegee 80 formed of rubber is fitted in, and fixed to, the elongate recess 74 formed in the first plate-like member 70, and an elongate squeegee 82 formed of a metal sheet is fitted in, and fixed to, the elongate recess 76 formed in the second plate-like member 72. The above-described two side plates (not shown) also close lengthwise opposite ends of an elongate space defined between the two squeegees 80, 82. Thus, in the state in which the two squeegees 80, 82 are fixed to the two plate-like members 70, 72, the two members 70, 72, the side plates, and the two squeegees 80, 82 cooperate with one another to define a printing-material chamber 84.

A lower end of the first squeegee 80 has a plane surface which is parallel to the screen 13 and is about 1 mm long in the screen-print direction. The lower-end surface cooperates with a lower end of the second squeegee 82 to define a printing-material outlet 86 which opens toward the upper surface 17 of the screen 13. The printing-material outlet 86 is communicated with the printing-material chamber 84, and has a length equal to that of the chamber 84, i.e., a dimension equal to that of the chamber 84 as measured in a widthwise direction of the screen 13.

A creamed-solder pushing device 90 as a printing-material pushing device is fixed to a side surface of the pivotable member 62 as seen in the screen-print direction. Thus, the pushing device 90 is pivotable with the pivotable member 62 about the axis line parallel to the screen-print direction. The pushing device 90 includes a support member 92 which is fixed to the pivotable member 62 such that the support member 92 is inclined relative to the pivotable member 62 in a direction parallel to that in which the printing-material container 68 is inclined relative to the support member 66. A housing 96 of a creamed-solder-pushing air-cylinder device 94 is fixed to the support member 92. A piston rod 98 of the air cylinder 94 projects downward from the housing 96, and a pushing plate 102 is held by a holder member 100 fixed to a lower end of the piston rod 98. The pushing plate 102 is located relative to the printing-material container 68 such that the plate 102 and the printing-material chamber 84 extends along a common inclined plane.

The pushing plate 102 has such dimensions which assure that the plate 102 is slideably fitted in the printing-material chamber 84 and is elevated and lowered by the air cylinder 94. Even in a state in which the pushing plate 102 is positioned at an upper-end position thereof, a lower end portion 106 of the plate 102 does not completely come out of the chamber 84. The pushing plate 102 has an opening 104 which is formed through the thickness thereof.

A seal member 108 which is formed of an elastic or resilient material such as rubber or soft synthetic resin is attached to the lower end portion 106 of the pushing plate 102 so as to prevent the creamed solder from entering a possible space between the plate 102 and each of respective inner surfaces of the two plate-like members 70, 72 that cooperate with each other to define the printing-material chamber 84. The seal member 108 has a V-shaped transverse cross section, and is attached to a V-groove formed in a lower-end surface of the pushing plate 102. The seal member 108 has two side walls which approach, as seen in a downward direction, the two members 70, 72, respectively. A bar member 110 is provided inside the seal member 108. The bar member 110 extends in the lengthwise direction of the pushing plate 102, over the same length as that of the plate 102, and is fixed to the plate 102. More specifically described, the pushing plate 102 has a plurality of through-holes which are formed therethrough between the opening 104 and the V-groove, and a plurality of small screws 112 are provided in the through-holes, respectively, such the small screws 112 are threadedly engaged with a plurality of internally threaded holes of the bar member 110. Thus, the bar member 110 fixes the seal member 108 to the pushing plate 102.

Figure 3:
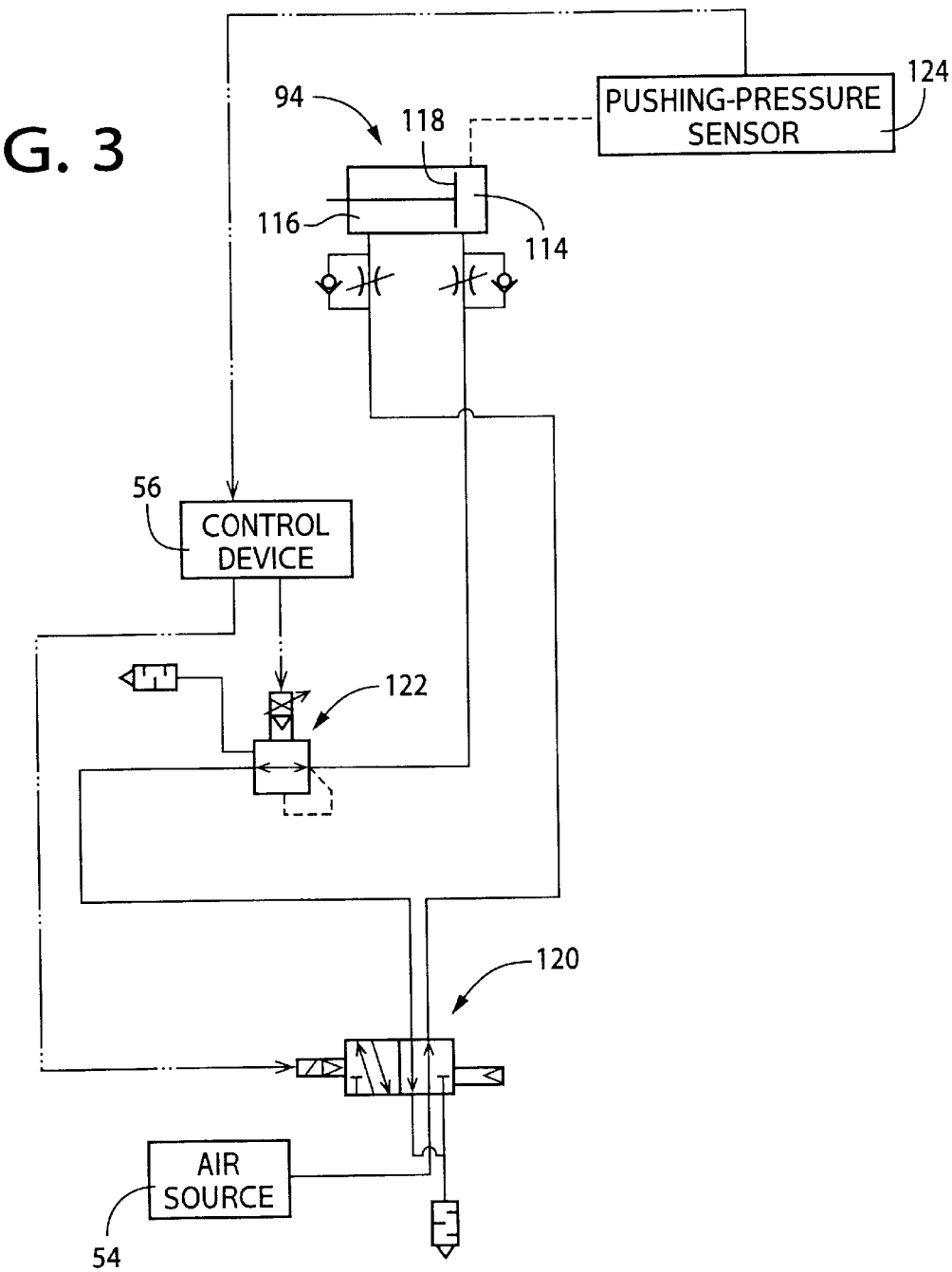
FIG. 3 is a diagrammatic view of a control circuit which controls a pushing air-cylinder device of the screen printing apparatus.

As shown in FIG. 3, the creamed-solder pushing air cylinder 94 has two air chambers 114, 116 each one of which is selectively connected to the air source 54 and the atmosphere by a solenoid-operated direction-switch valve 120, so that a piston 118 is moved up and down in the housing 96. A solenoid-operated proportioning valve 122 is provided between the first air chamber 114 and the direction-switch valve 120, and decreases the pressure of the pressurized air supplied from the air source 54 to the first air chamber 144 via the direction-switch valve 120. The first air chamber 144 is used to push the pushing plate 102 and thereby push the creamed solder out of the printing-material chamber 84. A pushing-pressure sensor 124 detects the pressure of the pressurized air supplied to the first air chamber 144, and the control device 56 controls, based on the electric signal supplied from the sensor 124, an electric current supplied to the proportioning valve 122, thereby controlling the air pressure in the first air chamber 144, to such a value which assures that the pushing plate 102 pushes the creamed solder out of the printing-material chamber 84 with a prescribed pushing force.

Figure 4:
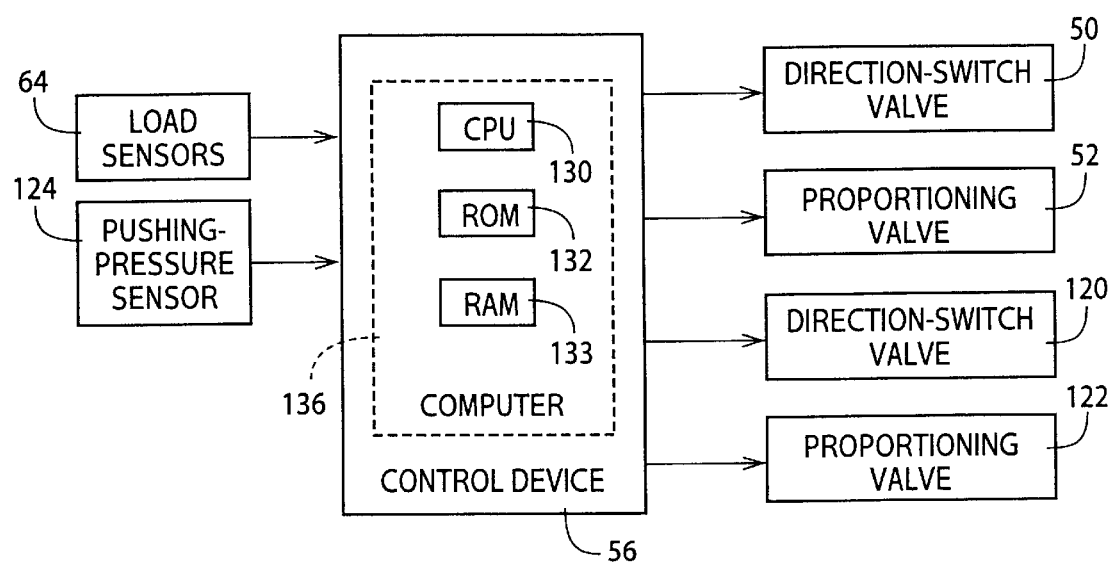
FIG. 4 is a diagrammatic view of a control device of the screen printing apparatus.

As shown in FIG. 4, the control device 56 is essentially provided by a computer 136 including a central processing unit ("CPU") 130, a read only memory ("ROM") 132, and a random access memory ("RAM") 134. The load sensors 64 and the pushing-pressure sensor 124 are connected to an input port of the control device 56, and an output port of the same 56 is connected to the direction-control valves 50, 120 and the proportioning valves 52, 122.

Next, the operation of the screen printing apparatus 10 constructed as described above will be described below.

When the present screen printing apparatus 10 carries out a printing operation on a PWB 15, first, the PWB 15 is held in contact with the lower surface of the screen 13, or positioned close to the lower surface. Second, the retainer member 19 and the printing head 38 are lowered by the printing-head elevating and lowering air cylinder (not shown). After the retainer member 19 is lowered to its lower-end position, the printing head 38 is lowered relative to the retainer member 19 by the contact-load adjusting air cylinder 21, so that the two squeegees 80, 82 are brought into contact with the upper surface 17 of the screen 13.

When the printing head 38 is lowered to cause the printing-material outlet 86 to contact the screen 13, the control device 56 controls, based on the output signal supplied from the load sensors 64, the pressure of the pressurized air supplied to the contact-load adjusting air cylinder 21, and thereby controls the contact load with which the outlet 86 contacts the screen 13, at the prescribed load. Then, the pushing plate 102 is driven or moved by the pushing air cylinder 94 to apply a pushing pressure to the creamed solder. However, since the outlet 86 of the printing-material container 68 is currently closed by the screen 13, the creamed solder does not leak from the outlet 86 and is appropriately pressurized. From this state, the printing head 38 is moved on the screen 13, while the creamed solder held in the printing-material chamber 84 is prevented from leaking from the chamber 84 by the downstream-side squeegee 80 as viewed in the screen-print direction and the creamed solder placed on the screen 13 is wiped out by the upstream-side squeegee 82. Each time the outlet 86 faces one through-hole 14 of the screen 13, an appropriate amount of the screamed solder is squeezed into the through-hole 14, and an excessive amount of the solder is wiped out by the upstream-side squeegee 82, so that the through-hole 14 is filled with the solder. Thus, the printing head 38 provides a pressure-type printing head or a pressure-type applying head which applies a pressure to the creamed solder held thereby, squeezes the solder into the through-holes 14, and applies the solder to the object. This is a printing step at which the creamed solder is screen-printed on the PWB 15.

The pushing plate 102 is lowered to push the creamed solder out of the printing-material chamber 84. The pushing-pressure sensor 124 detects the air pressure in the air chamber 114 of the air cylinder 94 and the control device 56 controls, based on the output signal supplied from the pressure sensor 124, the air pressure so that the creamed solder is pushed out of the chamber 84 with the prescribed pressure. Thus, even if the remaining amount of the solder may decrease, the solder is always pushed out of the chamber 84 with the prescribed pressure, so that the solder is always squeezed into each through-hole 14 and applied to the PWB 15. After the printing operation on one PWB 15 is completed, the printing head 38 is elevated so that the printing-material outlet 86 is moved away from the screen 13.

Figure 5:
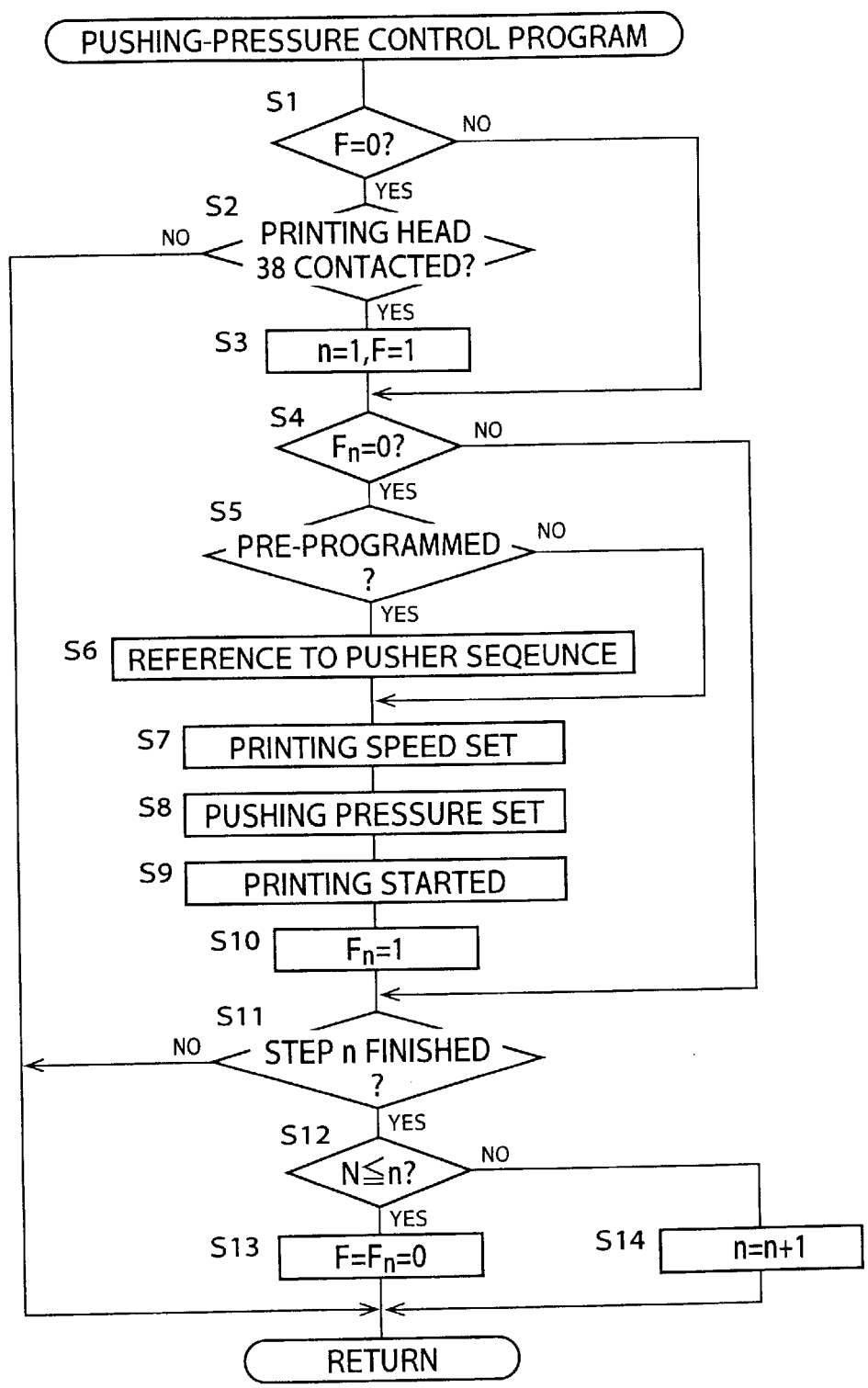
FIG. 5 is a flow chart representing a pushing-pressure control program which is stored in a read only memory ("ROM") of a computer as part of the control device.
Figures 6, 7:
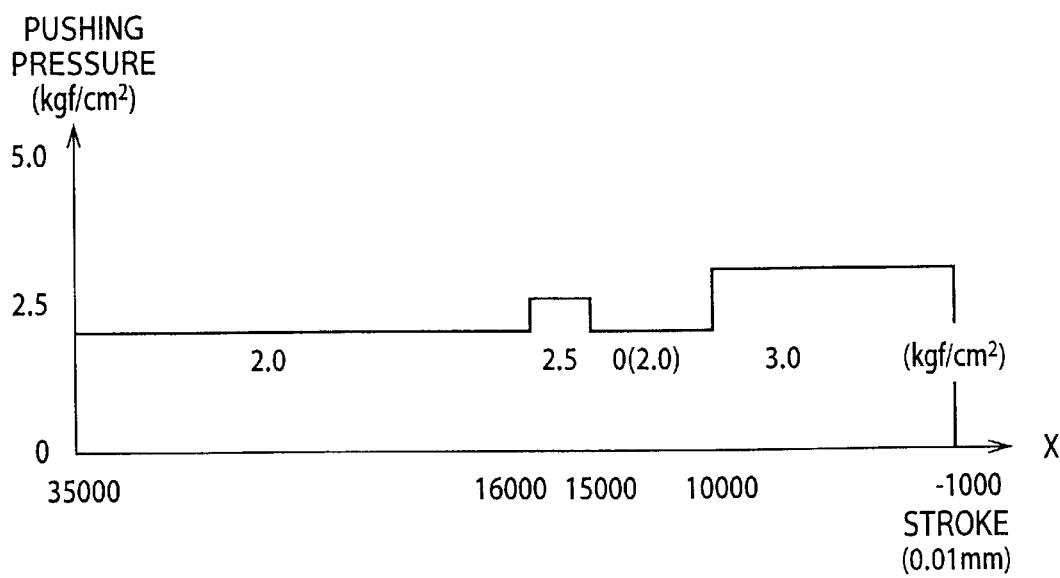
FIG. 6 is a table representing a predetermined pushing-pressure pattern which is employed in the pushing-pressure pressure control program.
FIG. 7 is a graph showing the pushing-pressure pattern.

The ROM 132 of the computer 136 stores, in advance, the pushing-pressure control program represented by the flow chart of FIG. 5. According to this control program, the control device 56 controls the air pressure supplied to the pushing air cylinder 94. This program is repeatedly carried out after one printing operation is commanded and before the one printing operation is finished, so that the control device 56 controls the air cylinder 94, according to a predetermined pushing-pressure pattern, based on the relative position between the printing head 38 (strictly, the middle position of the printing-material outlet 86 as seen in the screen-print direction) and the screen 13 or the PWB 15. One printing operation is divided into a plurality of (five, in the present embodiment) steps, and the pushing-pressure pattern provides, for each of the steps, an amount or distance of relative movement between the printing head 38 and the screen 13 (a distance of movement of the printing head 38 relative to the screen 13 in the screen-printing (i.e., X-axis) direction, in the present embodiment), a pushing pressure with which the pusher (pushing plate) 102 pushes the creamed solder, and a speed at which the printing head 38 is moved. That is, the pushing-pressure pattern provides, for each of a plurality of predetermined ranges of movement of the printing head 38, a pushing pressure of the pusher 102, and a speed of movement of the printing head 38. The pushing-pressure pattern is stored in the form of a pusher-sequence table as shown in FIG. 6. According to this table, Steps 1 to 5 are sequentially carried out in this order. In the table, "X" (stroke; 0.01 mm) indicates an X-axis-direction position where each step starts; "PUSHER" indicates a pushing pressure (unit; 0.1 kgf/cm$^2$); and "SPEED" indicates a speed of movement of the head 38 (unit; mm/sec). In the following description, the five steps shown in the pusher sequence of FIG. 6 will be referred as "STEPs 1 to 5", for being distinguished from the fifteen steps, shown in the flow chart of FIG. 5, which will be referred to as "S1 to S15".

FIG. 7 shows a graph whose axis of abscissa indicates the pushing pressure (kgf/cm$^2$) and whose axis of ordinate indicates the X-axis-direction position. In the present embodiment, since the standard value for the pushing pressure is predetermined at 20 (unit; 0.1 kgf/cm$^2$), the pushing pressure is not decreased to any values lower than the standard value during each printing operation even though the pusher sequence may provide those values.

In the present embodiment, STEP 1 starts at the position, X=35000 (stroke; 0.01 mm). For this step, the pushing pressure is prescribed at 20 (unit; 0.1 kgf/cm$^2$), and the printing operation is started with the pushing pressure being maintained at 20. In the present embodiment, the speed of movement of the printing head 38 is prescribed, for STEPs 1 to 3, at 100 (unit; mm/sec) that is an ordinary speed. STEP 2 is started at X=16000, and the pushing pressure is prescribed at 25. STEP 3 that is started at X=15000 corresponds to a range in which no through-hole 14 of the screen 13 is present, and accordingly the pushing pressure is prescribed at 0. However, as described previously, since the standard value for the pushing pressure is prescribed at 20, the printing head 38 is moved, in fact, with the creamed solder being subject to the pushing pressure equal to 20. For STEP 4, the pushing pressure is set to 30, and the speed is set to 50. Those values are maintained while the head 38 is moved from X=10000 to X=−1000. Finally, at STEP 5, the pushing pressure is decreased to zero, and one printing operation is finished. In the present embodiment, when the printing head 38 is moved on a portion of the screen 13 where the printing material is not easily squeezed into the through-holes 14, the pushing pressure is increased and the speed of movement of the head 38 is decreased. Thus, the quality of printing is improved.

Next, the pushing-pressure control program will be described in detail by reference to the flow chart of FIG. 5. This flow chart is generalized such that one printing operation consists of N steps. In the following description, however, it is assumed for easier understanding purposes only that the total number N of the steps is five.

The pushing-pressure control program is carried out when the starting of one printing operation is commanded by an operator. First, the control device 56 waits for the printing head 38 to be lowered and contact the screen 13. More specifically described, at Step S1, the control device 56 judges whether a flag, F, is equal to zero (i.e., F=0?). F=0 indicates a state in which the head 38 is not contacting the screen 13, and F=1 indicates a state in which the head 38 is contacting the screen 13. When the present control program is carried out for the first time during one printing operation, the flag F is initialized to zero. Therefore, a positive judgment is made at Step S1. Thus, the control of the control device 56 goes to Step S2 to judge whether the printing head 38 has been lowered and brought into contact with the screen 13. If a contact load detected by the load sensors 64 is not smaller than a prescribed value, a positive judgment is made at Step S2. On the other hand if the detected contact load is smaller than the prescribed value, a negative judgment is made at Step S2, and one cycle according to the present program is ended. Thus, Steps S1 and S2 are repeated after the starting of one printing operation is commanded and before the contact of the printing head 38 with the screen 13 is detected. If a positive judgment is made at Step S2, the control goes to Step S3 to set the flag F to F=1 and set the number, n, of the current STEP to n=1. Thereafter, Steps S2 and S3 are skipped until one printing operation is finished.

Next, at Step S4, the control device 56 judges whether a flag, $F_n$, is equal to 0 (i.e., $F_n$=0?). One flag $F_n$ is provided for each of the STEPS. In the present embodiment, five flags $F_1$, $F_2$, $F_3$, $F_4$, and $F_5$ are provided for the five STEPs, respectively. $F_n$=0 indicates a state in which the corresponding STEP has not been started yet, and $F_n$=1 indicates a state in which the corresponding STEP has been started already.

All the flags $F_n$ are initialized to zero. Since the current step is STEP 1 (i.e., n=1), the control device 56 judges, at Step S4, whether the flag $F_n$ is equal to zero (i.e., $F_n$=0?). If a positive judgment is made at Step S4, the control goes to Step S5.

At Step S5, the control device 56 judges whether the current STEP n (n=1) is a pre-programmed step. An operator can operate, in advance, a control panel (not shown) of the control device 56, for pre-programming each STEP, that is, commanding the control device 56 to cahnge, for each STEP, a print range, a pushing pressure, and a speed of movement of the printing head 38, according to the predetermined pusher sequence shown in FIG. 6. If a negative judgment is made at Step S5, Step S6 is skipped and the control goes to Step S7 where the control device 56 controls the air pressure supplied to the pushing air cylinder 94, based on a standard pushing pressure pre-stored in the ROM 132, so that the creamed solder receives the standard pressing pressure throughout the current printing operation. At Step S8, the control device 56 sets the print speed to a standard speed of movement of the printing head 38, pre-stored in the ROM 132, so that the head 38 is moved at the standard moving speed throughout the current printing operation. On the other hand, if a positive judgment is made at Step S5, the control goes to Step S6 to refer to the pusher sequence shown in FIG. 6 and read a print range, a pushing pressure, and a speed of movement of the printing head 38, each for STEP 1.

At Step S7, the print speed is set to the speed of movement of the printing head 38, read at Step S6. Thus, in the present embodiment, the speed of movement of the printing head 38 can be changed for each of a plurality of steps belonging to one printing operation. Next, at Step S8, the control device 56 controls the air pressure supplied to the pushing air cylinder 94, based on the pushing pressure read at Step S6, so that the creamed solder receives the pressing pressure. At Step S9, the control device 56 commands the starting of printing for STEP 1. At Step S10, the flag $F_1$ is set to $F_1$=1. At Step S11, the control device 56 judges whether the printing for STEP 1 has been finished. If the printing head 38 has not reached the end position for STEP 1, a negative judgment is made at Step S11, and the current cycle is ended. Thus, Steps S1, S4, and S11 are repeated till the printing for STEP 1 is finished. When the printing for STEP 1 is finished, a positive judgment is made at Step S11, and the control goes to Step S12 to judge whether the final STEP has been finished, more specifically described, judge whether the number "n" of the current STEP is not smaller than the total number "N" of the STEPs of the current printing operation. A positive judgment made at Step S12 indicates that one printing operation for one PWB 15 has been finished. In this case, the control goes to Step S13 to reset all the flags F, $F_n$ to F=$F_n$=0. On the other hand, if a negative judgment is made at Step S12, the control goes to Step S14 to add one to the number "n" and thereby update the number "n" to n+1. Thus, the next STEP is started.

As is apparent from the foregoing description, the squeegee moving device (not shown) provides a moving device which moves at least one of the printing head 38 and the screen 13 or the PWB 15 as the object, relative to the other of the head 38 and the screen 13 or the PWB 15; the pushing air cylinder 94, the pushing plate 102, and a portion of the computer 136 of the control device 56 that carries out the pushing-pressure control program cooperate with one another to a pushing-pressure control device; Steps S5 and S6 of the pushing-pressure control program provide a basic-information obtaining step; and Step S8 of the control program provides a pushing-pressure control step.

Thus, the present screen printing apparatus 10 can easily print, with improved printing quality, the creamed solder on the PWB 15 by changing the creamed-solder pushing pressure according to the predetermined pushing-pressure pattern. For example, since the present apparatus 10 can move the printing head 38 at a low speed only while the pushing pressure is kept at a high value, the apparatus 10 can easily improve the printing quality without lowering the printing efficiency.

In the first embodiment shown in FIGS. 1 to 7, the pushing pressure values applied to the creamed solder to push the solder out of the printing head 38 are predetermined and are pre-stored in the form of the pusher sequence pre-stored in the ROM 132 of the computer 136 of the control device 56. On the other hand, in a second embodiment of the present invention, the screen printing apparatus 10 is modified to include a condition inspecting device 226, shown in FIG. 8, which is electrically connected to the control device 56 and which inspects a condition of a creamed solder 380 printed on a PWB 15, and the control device 56 is modified to adjust the pressing pressure applied to the creamed solder, based on the result of the inspection. In the second embodiment, the control device 56 changes, for the first or initial printing operation for the first PWB 15 using the screen 13, the pressing pressure applied to the creamed solder, according to the predetermined pushing-pressure pattern shown in FIG. 7 (i.e., the pusher sequence shown in FIG. 6), like the first embodiment. However, before the second printing operation is carried out for the second PWB 15 using the same screen 13, the inspecting device 226 inspects a condition of one or more creamed solders 380 printed on the first PWB 15, and the control device 56 adjusts the pushing pressure changed according to the predetermined pushing-pressure pattern.

In the second embodiment, the inspecting device 226 is provided at an inspecting position distant from a printing position where the squeegee unit 12 prints the creamed solder on each PWB 15. At the inspecting position, the inspecting device 226 inspects a condition of one or more creamed solders 380 printed on the each PWB 15 that is conveyed from the printing position to the inspecting position by a PWB conveying device (not shown). Since the inspecting device 226 is disclosed in Japanese Patent Application No. 11(1999)-226586 and the corresponding U.S. Patent Application assigned to the assignee of the present application, the inspecting device 226 will be briefly described below.

Figure 8:
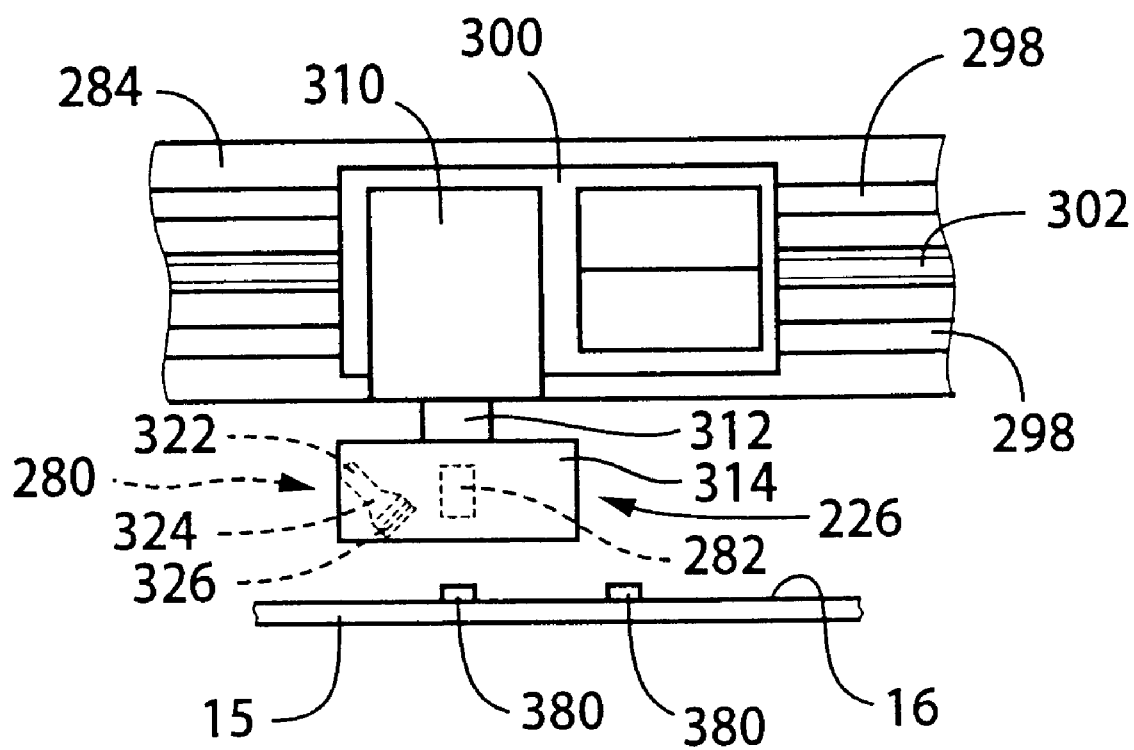
FIG. 8 is a side elevation view of an inspecting device which may be employed in the screen printing apparatus of FIG. 1 in a second embodiment of the present invention.

The inspecting device 226 includes, as shown in FIG. 8, a planar-light source 280 and a two-dimensional-image taking device 282 which are moved to an arbitrary position in a direction parallel to the horizontal, upper surface 16 of the PWB 15, so that the inspecting device 226 inspects the creamed solder 380 printed on the PWB 15. To this end, a Y-axis slide member 284 is employed and is moved by a Y-axis servomotor (not shown) as part of a Y-axis-slide-member moving device.

The Y-axis slide member 284 has a vertical side surface which supports a pair of guide rails 298 which extend parallel to the X-axis direction, and an X-axis slide member 300 is movably fitted on the guide rails 298. A nut (not shown) is fixed to the X-axis slide member 300, and is threadedly engaged with a ball screw 302 which is supported by the Y-axis slide member 284 such that the screw 302 is rotatable about a horizontal axis line and is not movable in an axial direction parallel to the axis line. When the ball screw 302 is rotated by an X-axis servomotor (not shown), the Xaxis slide member 300 is moved by being guided by the guide rails 298. Thus, the guide rails 298 provide a guide device; and the nut, the ball screw 302, and the X-axis servomotor cooperate with one another to provide an X-axis-slide-member moving device.

The X-axis slide member 300 supports a holder-rotating air-operated cylinder device 310 as a holder rotating device. The air cylinder 310 is oriented in a vertical direction perpendicular to the upper surface 16 of the PWB 15, and includes a rotatable axis member 312 which is rotatable about a vertical axis line within a prescribed range of 90 degrees which is defined by one or two stoppers (not shown). The axis member 312 extends downward from the X-axis slide member 300, and supports, at its lower end thereof, a holder 314. The holder 314 is moved, by the Y-axis-slide-member and X-axis-slide-member moving devices, to an arbitrary position on a horizontal plane, and is rotated about the vertical axis line within the range of 90 degrees by the air cylinder 310.

As shown in FIG. 8, the holder 314 holds the planar-light source 280 and the two-dimensional-image taking device 282. In the present embodiment, the planar light source 280 includes a semi-conductor laser device 322; a beam expander 324 which expands the diameter of a light beam emitted by the laser device 322 and converts the expanded light beam into a flux of parallel lights having a circular cross section; and a slit plate 326 which has an elongate, straight slit and converts the parallel lights into a planar light as seen in a direction perpendicular to the slit and the direction of propagation of the light. Various sorts of slit plates 326 whose slits have different lengths may be prepared and may be selectively used. In the latter case, the planar-light source 280 can emit various sorts of planar lights whose transverse cross sections have different lengths. The planar light may be emitted by any other sort of device which is known to be able to emit a planar light, such as a cylindrical lens, an aspherical lens, or a combination of those lenses.

In the present embodiment, the two-dimensional-image taking device 282 is provided by a CCD (charge-coupled devices) camera having a two-dimensional image-take surface 328 (FIG. 12) on which an image is formed. The CCD camera includes CCDs (charge-coupled devices) each as a sort of solid image sensor, and a lens system including an image-forming lens which forms a two-dimensional image on the image-take surface 328 provided by the CCDs. The CCDs are a number of small light-sensing elements arranged on a plane, and the CCD camera 282 generates respective electric signals representing the light amounts or intensities detected by the light sensing elements, i.e., the CCDs. Those electric signals provide a batch of image data representing the two-dimensional mage which is formed on the image-take surface 328 and which includes a number of picture elements or pixels corresponding to the number of CCDs, respectively.

The holder 314 holds the planar-light source 280 and the two-dimensional-image taking device 282 such that the light source 280 and the image taking device 282 keep a pre-scribed relative position therebetween where an optical axis of the light source 280 is inclined by 45 degrees relative to a perpendicular to the horizontal, upper surface 16 of the PWB 15, an optical axis of the image taking device 282 is perpendicular to the upper surface 16 of the PWB 15, i.e., parallel to the perpendicular to the upper surface 16, and those two optical axes intersect each other. The optical axis of the image taking device 282 is perpendicular to the upper surface 16 of the PWB 15, and accordingly is angled by 0 angle relative to the perpendicular to the upper surface 16.

Therefore, the holder 314 holds the light source 280 and the image taking device 282 such that the respective optical axes of the light source 280 and the image taking device 282 are angled by different angles relative to the perpendicular to the upper surface 16 of the PWB 15. In addition, in the present embodiment, the holder 314 holds the light source 280 and the image taking device 282 such that the respective optical axes of the light source 280 and the image taking device 282 intersect each other at a center of a cross section of a creamed solder 380 printed on the surface 16 of the PWB 15, the cross section being taken along a plane inclined by 45 degrees relative to the surface 16. Thus, the light source 280 and the image taking device 282 cooperate with each other to take a two-dimensional image of the creamed solder 380 printed on the surface 16 of the PWB 15 being positioned at the inspecting position.

Figure 9:
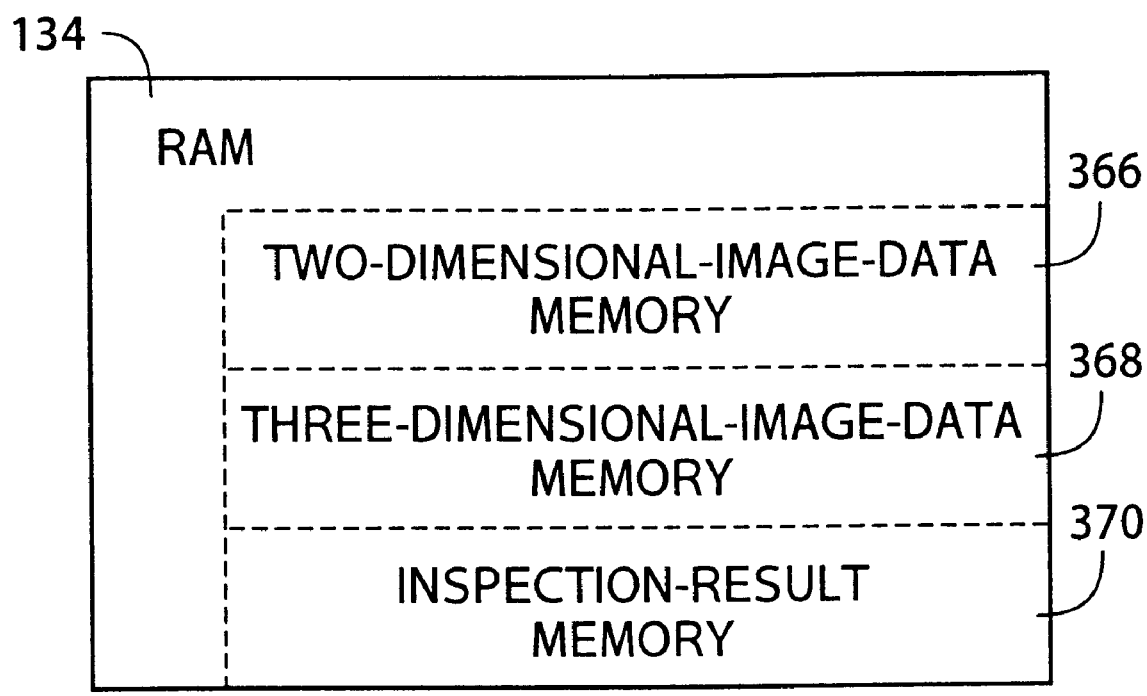
FIG. 9 is an illustrative view of various memory areas of a random access memory ("RAM") of a control device which is used with the inspecting device of FIG. 8 in the second embodiment.
Figure 10:
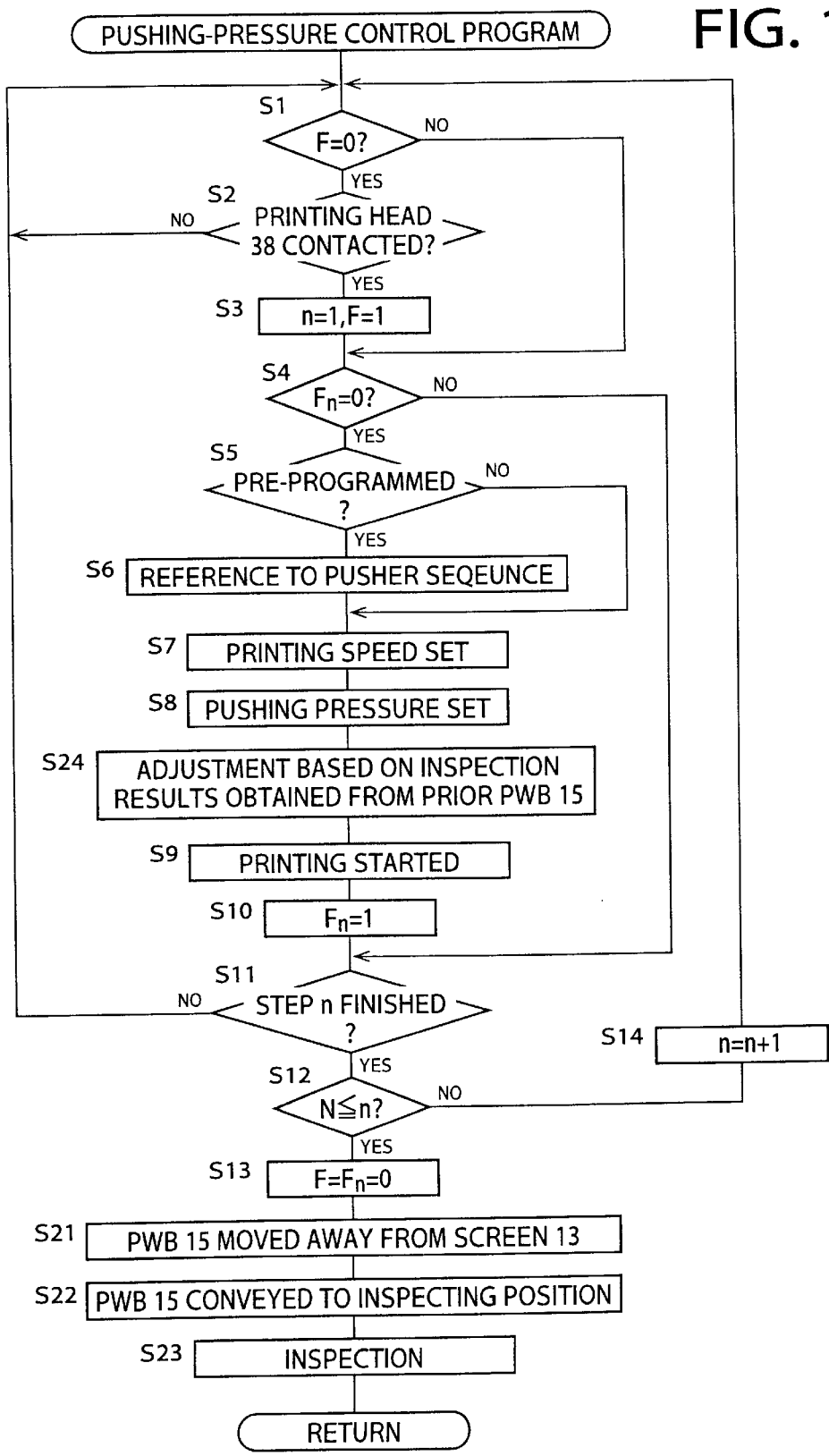
FIG. 10 is a flow chart representing a pushing-pressure control program which is stored in a ROM of the control device in the second embodiment.

The ROM 132 stores a modified pushing-pressure control program represented by the flow chart of FIG. 10. The RAM 134 includes, as shown in FIG. 9, a two-dimensional-image-data memory 366, a three-dimensional-image-data memory 368, and an inspection-result memory 370, in addition to a working memory.

Since Steps S1 to S14 of the flow chart of FIG. 10 are the same as Steps S1 to S14 of the flow chart of FIG. 5, the description of those steps is omitted. After one printing operation for one PWB 15 (e.g., the first printing operation for the first PWB 15) is finished at Step S13, the control of the control device 56 goes to Step S21 to lower the first PWB away from the screen 13, by a PWB supporting and moving device (not shown), so that the first PWB 15 is placed on the PWB conveying device. Step S21 is followed by Step S22 to operate the PWB conveying device to convey the PWB 15 to the inspecting position.

After the PWB 15 is conveyed to the inspecting position and is stopped there by an inspection-related stopper device (not shown), Step S23 is carried out. The inspection is carried out by moving the PWB 15 and/or the combination of the planar-light source 280 and the two-dimensional-image taking device 282, relative to each other, in directions parallel to the surface 16 of the PWB 15, in a state in which the screen 13 is absent from above the PWB 15.

Figure 11:
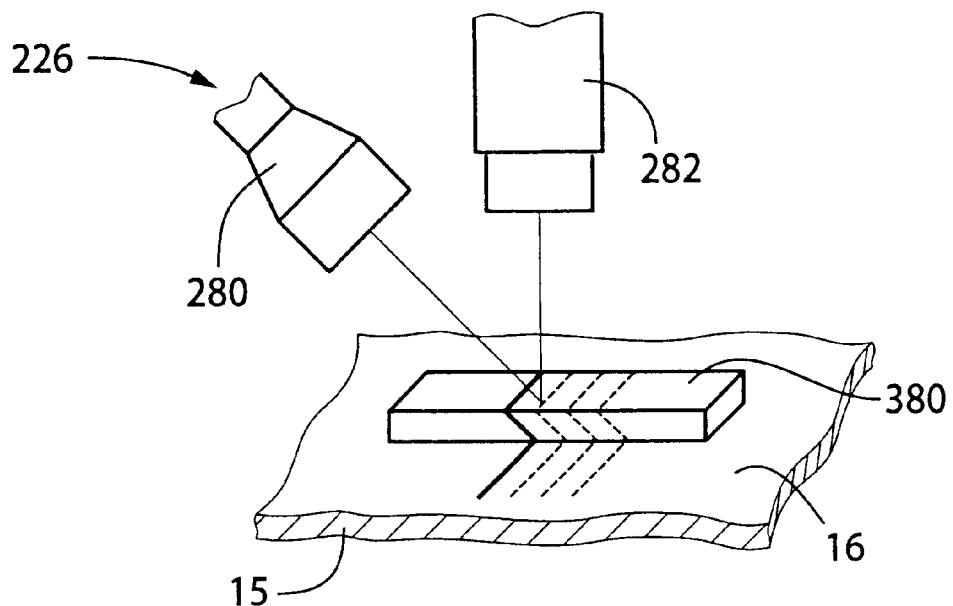
FIG. 11 is a view for illustrating the manner in which a planar-light source of the inspecting device of FIG. 8 emits a planar light toward a creamed solder printed on a printed wiring board and a two-dimensional-image taking device of the inspecting device takes a two-dimensional image of the creamed solder.

More specifically described, first, the holder 314 is moved by the X-axis-direction and Y-axis-direction moving devices, so that the planar-light source 280 and the two-dimensional-image taking device 282 take a two-dimensional image of a creamed solder 380 (FIG. 11) printed on the upper, planar surface 16 of the PWB 15. Each of the through-holes 14 of the mask screen 13 has a rectangular cross section as taken along a plane parallel to the screen 13, and the creamed solder 380 printed on the upper surface 16 of the PWB 15 has, as shown in FIG. 11, a three-dimensional shape, i.e., a rectangular-parallelepiped (e.g., cubic) shape which projects upward from the surface 16. The solder 380 has four first sides parallel to the X-axis direction, and four second sides perpendicular to the first sides and parallel to the Y-axis direction.

On the upper surface 16 of the PWB 15, a plurality of creamed solders 380 are printed at a plurality of print spots prescribed on the surface 16. In the present embodiment, only a portion (one, two, . . . , but not all) of the creamed solders 380 printed on the surface 16 is subjected to the inspection. For example, creamed solders 380 are subjected to a sampling inspection in which different creamed solders 380 printed at different print spots are selected for different PWBs 15 and are subjected to the inspection. Since not all the creamed solders 380 printed on each PWB 15 are subjected to the inspection, the inspection of each PWB 15 can be completed in a short time, while effectively preventing the production of a defective printed circuit board resulting from the defective printing. However, in the case where a long time can be used to inspect each PWB 15, it is possible to inspect all the creamed solders 380 printed on the each PWB 15.

The planar-light source 280 emits, as shown in FIG. 11, a planar light to the above-indicated portion (one, two, . . . , but not all) of the creamed solders 380 printed on the PWB 12, and the two-dimensional-image taking device 282 takes a two-dimensional image of each of the creamed solders 380. To this end, the holder 314 is moved by the moving devices, and the light source 280 and the image taking device 282 are moved, while kept their prescribed positions relative to each other, relative to the each printed creamed solder 380 as a three-dimensional object, along a predetermined movement path. In the second embodiment, the predetermined path is a straight path which extends parallel to the upper surface 16 of the PWB 15 and to the longest sides of the rectangular-parallelepiped creamed solder 380. In addition, the holder 314 is rotated by the holder-rotating air cylinder 310, so that the plane including the respective optical axes of the light source 280 and the image taking device 282 extends, as shown in FIG. 11, parallel to the longest sides of the creamed solder 380 and to the movement path.

Figure 12:
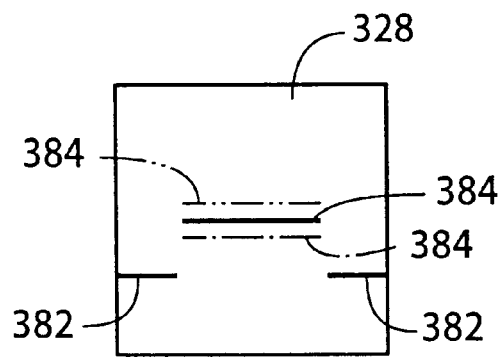

While the planar-light source 280 and the two-dimensional-image taking device 282 are continuously moved relative to the creamed solder 380 as described above, the image taking device 282 sequentially takes respective images of respective portions of the creamed solder 380 which are sequentially exposed to the planar light emitted by the source 280. The image taking device 282 performs a plurality of image taking operations, at a predetermined interval of time, and thereby obtains a plurality of two-dimensional images. In each of the image taking operations, the image-take surface 328 of the image taking device 282 forms, as shown in FIG. 12, respective images 382, 384 of respective portions of the PWB surface 16 and the creamed solder 380 that are exposed to the planar light. Since the creamed solder 380 projects upward from the surface 16, the image 382 of the exposed portion of the surface 16 and the image 384 of the exposed portion of the solder 380 are formed at different positions on the image-take surface 328. In addition, since the light source 280 emits the planar light toward the solder 380, and the image taking device 282 takes a two-dimensional image of the solder 380, in the state in which the plane including the respective optical axes of the two devices 280, 282 extends parallel to the longest sides of the solder 380, the two-dimensional image taken by the image taking device 282 corresponds to an image as seen in a direction inclined by 45 degrees relative to a plane which perpendicularly intersects the longest sides of the solder 380 and is inclined by 45 degrees relative to the PWB surface 16 and along which the image is taken as a cross section of the solder 380. More strictly described, the device 282 takes a two-dimensional image of only respective portions of the respective upper surfaces of the solder 380 and the PWB 15 that are exposed to the planar light.

The relative-position relationship between the planar-light source 280 and the two-dimensional-image taking device 282 is not changed, and the predetermined movement path is parallel to the surface 16 of the PWB 15. Therefore, in each of the plurality of two-dimensional images obtained by the device 282, the image 382 of the exposed portion of the PWB surface 49 is formed at substantially the same position on the image-take surface 328 of the CCD camera. In addition, since the creamed solder which is correctly or properly printed on the PWB 15 has a rectangular-parallelepiped shape and the upper surface thereof has a constant height, the image 384 of the exposed portion of the solder 380 should be formed, in each of the plurality of image taking operations, at substantially the same position on the image-take surface 328, and simultaneously substantially the same position relative to the position where the image 382 of the exposed portion of the PWB 15 is formed. Even in the case where the height of the upper surface of the solder 380 is not even, an image 384 is formed, as indicated at one-dot or two-dot chain line in FIG. 12, at a position near the image 384 of the exposed portion of the correctly printed solder 380 and never far from the same. Therefore, the control device 56 needs to transfer and process image data corresponding to only a limited portion of the image-take surface 328, i.e., need not transfer or process all the image data corresponding to the entire image-take surface 328. Since the control device 56 has only to transfer and process the reduced amount of image data, the control device 56 can transfer and process the image data in a reduced time.

A plurality of batches of image data representing the plurality of two-dimensional images obtained in the plurality of image taking operations are stored in the two-dimensional-image-data memory 366 of the RAM 134. Based on the plurality of batches of image data stored in the memory 366, the speed at which the planar-light source 280 and the two-dimensional-image taking device 282 are moved, and the interval of time at which the plurality of two-dimensional images are taken, the control device 56 calculates a batch of image data representing a three-dimensional image of the creamed solder 380, and stores the batch of three-dimensional-image data in the three-dimensional-image-data memory 368. Based on the batch of three-dimensional-image data in the memory 368, the control device 56 calculates an average height of the upper surface of the creamed solder 380 and the volume (i.e., amount) of the creamed solder 380. In addition, the control device 56 determines X-axis-direction and Y-axis-direction positions of the solder 380 and a two-dimensional shape of the solder 380 as seen in a direction perpendicular to the PWB 12. The control device 182 compares the thus calculated or determined amount, positions, and shape with reference or correct amount, positions, and shape of the correctly or properly printed creamed solder. Thus, the control device 56 can find various sorts of printing defects such as a short amount of the creamed solder 380, a printing of the solder 380 at an erroneous or incorrect position, and an excessive amount of the solder 380. The short amount of the solder 380 may be found when the two-dimensional shape of the solder 380 is not defective but the height of at least a portion of the upper surface of the solder 380 is insufficient, or when the two-dimensional shape of the solder 380 is defective, i.e., incomplete. The inspection results, i.e., whether each solder 380 has at least one printing defect and what sort of printing defect the each solder 380 has are stored, in the inspection-result memory 370, with the X-axis-direction position where the each solder 380 is located. This is the inspecting step at which the PWB 15 is moved away from the screen 13 and the creamed solder or solders 380 printed at the printing step is or are inspected.

When the next (e.g. second) printing operation is carried out for the next (e.g., second) PWB 15, Steps S1 to S8 of the flow chart of FIG. 5 are carried out like the prior (i.e., first) printing operation. However, Step S8 is followed by Step S24 to adjust the moving speed set at Step S7 and/or the pushing pressure at Step S8, based on the inspection results obtained from the prior (e.g., first) PWB 15 and stored in the inspection-result memory 370 of the RAM 134. More specifically described, if the inspection results obtained from the prior PWB 15 indicate that the current STEP for the current PWB 15 will include at least one print spot where printing of an excessive amount of creamed solder was found by the inspection, the control device 56 decreases the moving speed set at Step S7 and/or increases the pushing pressure set at Step S8; and if the inspection results indicate that the current STEP will include at least one print spot where printing of a short or insufficient amount of creamed solder was found by the inspection, the control device 56 increases the moving speed set at Step S7 and/or decreases the pushing pressure set at Step S8. The amount of increasing or decreasing of the pushing pressure or the moving speed of the head 38 may be changed depending on the excessive or short amount of creamed solder. Alternatively, it is possible to change the pushing pressure or the moving speed of the head 38 by a constant value whenever the excessive or short amount of creamed solder exceeds a threshold value. Step S23, i.e., the inspecting step may be carried out for only a predetermined number (e.g., 10) of PWBs 15 in an initial screen-printing period. Alternatively, Step S23 may be skipped after this step has been carried for a predetermined number of PWBs 15 in an initial period and it has been ascertained that printing operations can be stably carried out.

In the second embodiment, the modified screen printing apparatus 10 including the inspecting device 226 adjusts the pushing pressure based on both the predetermined. pushing-pressure pattern shown in FIG. 7 and the inspection results obtained at Step S23. Therefore, even if the pushing pressure set for the first printing operation for the first PWB 15 may be more or less inappropriate, the quality of printing can be eventually improved as the total number of printing operations increases.

In a third embodiment, the modified pushing-pressure control program represented by the flow chart of FIG. 10 is further modified by deleting Steps S5 and S6. In the third embodiment, when the first printing operation is carried out for the first PWB 15, the control device 56 sets, at Step S7, a standard moving speed for the entire portion of the first PWB 15, and sets, at Step S8, a standard pushing pressure for the entire portion of the first PWB 15. And, when the second printing operation is carried out for the second PWB 15, the control device 56 adjusts, at Step S24, the standard moving speed set at Step S7 and the standard pushing pressure set at Step S8, based on the inspection results obtained from the first PWB 15 and stored in the memory 370 of the RAM 134. In this case, the control device 56 may, or may not, adjust the standard moving speed and the standard pushing pressure for a particular STEP of each printing operation, depending on at which position one or more defective creamed solders 380 were found on the upper surface 16 of the PWB 15. However, it is possible to adjust the standard moving speed and the standard pushing pressure for all the STEPs of each printing operation, irrespective of where one or more defective creamed solders 380 were found on the upper surface 16 of the PWB 15.

While the present invention has been described in its preferred embodiments, the present invention is not limited to the features described in SUMMARY OF INVENTION and the features described in PREFERRED EMBODIMENTS OF INVENTION, but may be embodied with other changes, improvements, and modifications that may occur to a person skilled in the art without departing from the scope and spirit of the invention defined in the appended claims.

What is claimed is:

1. A method of controlling a pushing pressure which is applied to a printing material, such as a creamed solder, to push the material out of a printing head of a screen printing apparatus and print the material on an object, such as a printed wiring board, through a plurality of through-holes of a screen of the apparatus while at least one of the head and the screen is moved relative to the other of the head and the screen in a direction parallel to the screen, the method comprising the step of:

changing the pushing pressure applied to the printing material to push the printing material out of the printing head and print the printing material on the object through the through-holes of the screen, while a printing operation is carried out on the object by the screen printing apparatus, wherein the step of changing the pushing pressure comprises changing the pushing pressure according to a predetermined pressure pattern representing a relationship between relative position of the printing head and the screen, and pressure, said relationship including at least two distinct pressure values corresponding to at least two distinct relative positions of the printing head and the screen, respectively.

2. A method according to claim 1, further comprising the steps of:

inspecting a condition of the printing material printed on the object; and adjusting, based on a result of the inspection, the pushing pressure changed according to the predetermined pressure pattern.

3. A method according to claim 2, wherein the step of inspecting the condition comprises taking an image of the printing material printed on the object.

4. A method according to claim 3, wherein the step of taking the image comprises emitting a planar light toward the object and the printing material printed on the object and taking an image of respective portions of the object and the printing material that are exposed to the planar light.

5. A method according to claim 4, wherein the step of inspecting the condition comprises:

taking respective images of a plurality of portions of the object and a plurality of portions of the printing material printed on a surface of the object that are sequentially exposed to the planar light when at least one of the planar light and the object is moved relative to the other of the planar light and the object in a direction parallel to the surface of the object; and calculating, based on the taken images, an amount of the printing material printed on the object.

6. A method according to claim 1, further comprising the step of changing a speed at which said at least one of the printing head and the screen is moved relative to the other of the head and the screen, in said direction parallel to the screen, while said printing operation is carried out on the object by the screen printing apparatus.

7. A method according to claim 1, wherein a first pressure value of said at least two distinct pressure values is greater than a second pressure value of said at least two distinct pressure values, said first pressure value corresponds to a first relative position of said at least two distinct relative positions, said second pressure value corresponds to a second relative position of said at least two distinct relative positions, and the printing material is less easily squeezed into at least one of the through-holes of the screen at said first relative position than at said second relative position.

8. A screen printing apparatus for printing a printing material on an object through a screen having a plurality of through-holes, comprising:

a printing head which includes (A) a printing-material container having (a1) a printing-material chamber in which the printing material is accommodated, and (a2) a printing-material outlet which communicates with the printing-material chamber and opens toward the screen, and (B) a printing-material pushing device which applies a pushing pressure to the printing material accommodated in the printing-material chamber to push the material out of the chamber;

a moving device which moves at least one of the printing head and a combination of the screen and the object relative to the other of the head and the combination, in a direction parallel to the screen; and a pushing-pressure control device which controls the pushing pressure applied to the printing material by the printing-material pushing device and which changes the pushing pressure applied to the printing material to push the printing material out of the printing-material chamber, while a printing operation is carried out on the object by the screen printing apparatus, wherein the pushing-pressure control device comprises a pattern-using control portion which changes the pushing pressure applied to the printing material according to a predetermined pressure pattern representing a relationship between relative position of the printing head and the screen, and pressure, said relationship including at least two distinct pressure values corresponding to at least two distinct relative positions of the printing head and the screen, respectively.

9. An apparatus according to claim 8, wherein the printing-material outlet linearly extends in a direction intersecting the direction in which the moving device moves the one of the printing head and the combination of the screen and the object relative to the other of the head and the combination, the printing-material chamber has a length substantially equal to a length of the outlet, and the printing-material pushing device includes a pushing member which is substantially fluid-tightly fitted in the printing-material chamber and a pushing-member drive device which moves the pushing member in the chamber toward the outlet.

10. An apparatus according to claim 9, wherein the pushing-member drive device comprises a pressurized-air-operated cylinder device, and the pushing-pressure control device comprises a pressure control device which controls a pressure of a pressurized air supplied to the cylinder device.

11. An apparatus according to claim 8, further comprising a condition inspecting device which inspects a condition of the printed material printed on the object, wherein the pushing-pressure control device further comprises a pushing-pressure adjusting portion which adjusts, based on a result of the inspection, the pushing pressure changed by the pattern-using control portion.

12. An apparatus according to claim 11, wherein the condition inspecting device comprises an image taking device which takes an image of the printing material printed on the object.

13. An apparatus according to claim 12, wherein the condition inspecting device further comprises an amount calculating device which calculates, based on a batch of image data which is produced by the image taking device and represents the taken image, an amount of the printing material printed on the object.

14. An apparatus according to claim 8, wherein a first pressure value of said at least two distinct pressure values is greater than a second pressure value of said at least two distinct pressure values, said first pressure value corresponds to a first relative position of said at least two distinct relative positions, said second pressure value corresponds to a second relative position of said at least two distinct relative positions, and the printing material is less easily squeezed into at least one of the through-holes of the screen at said first relative position than at said second relative position.

15. A method of controlling a pushing pressure which is applied to a printing material to push the material out of a printing head of a screen printing apparatus and print the material on an object through a plurality of through-holes of a screen of the apparatus while at least one of the head and the screen is moved relative to the other of the head and the screen in a direction parallel to the screen, the method comprising the step of:

changing the pushing pressure applied to the printing material to push the printing material out of the printing head and print the printing material on the object through the through-holes of the screen, while a printing operation is carried out on the object by the screen printing apparatus, wherein the step of changing the pushing pressure comprises pushing, at a first relative position of the printing head and the screen, the printing material at a first pressure value, and pushing, at a second relative position of the printing head and the screen, the printing material at a second pressure value smaller than the first pressure value, the printing material being less easily squeezed into at least one of the through-holes of the screen at said first relative position than at said second relative position.

16. A screen printing apparatus for printing a printing material on an object through a screen having a plurality of through-holes, comprising:

a printing head which includes (A) a printing-material container having (a1) a printing-material chamber in which the printing material is accommodated, and (a2) a printing-material outlet which communicates with the printing-material chamber and opens toward the screen, and (B) a printing-material pushing device which applies a pushing pressure to the printing material accommodated in the printing-material chamber to push the material out of the chamber;

a moving device which moves at least one of the printing head and a combination of the screen and the object relative to the other of the head and the combination, in a direction parallel to the screen; and a pushing-pressure control device which controls the pushing pressure applied to the printing material by the printing-material pushing device and which changes the pushing pressure applied to the printing material to push the printing material out of the printing-material chamber, while a printing operation is carried out on the object by the screen printing apparatus, wherein the pushing-pressure control device controls the printing-material pushing device to push, at a first relative position of the printing head and the screen, the printing material at a first pressure value, and push, at a second relative position of the printing head and the screen, the printing material at a second pressure value smaller than the first pressure value, the printing material being less easily squeezed into at least one of the through-holes of the screen at said first relative position than at said second relative position.

* * * * *